US011645968B2

(12) United States Patent
Feng et al.

(10) Patent No.: US 11,645,968 B2
(45) Date of Patent: May 9, 2023

(54) SHIFT REGISTER AND DRIVING METHOD THEREFOR, GATE DRIVING CIRCUIT, AND DISPLAY PANEL

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 75 days.

(21) Appl. No.: 17/424,483

(22) PCT Filed: Aug. 24, 2020

(86) PCT No.: PCT/CN2020/110806
§ 371 (c)(1),
(2) Date: Jul. 20, 2021

(87) PCT Pub. No.: WO2021/036984
PCT Pub. Date: Mar. 4, 2021

(65) Prior Publication Data
US 2022/0084457 A1  Mar. 17, 2022
US 2023/0103281 A9  Mar. 30, 2023

(30) Foreign Application Priority Data

Aug. 30, 2019 (CN) .......................... 201910815443.9

(51) Int. Cl.
*G09G 3/3266* (2016.01)
*G09G 3/20* (2006.01)
*G11C 19/28* (2006.01)

(52) U.S. Cl.
CPC ...................... *G09G 3/2092* (2013.01); *G09G 2310/0286* (2013.01); *G09G 2310/061* (2013.01); *G09G 2310/08* (2013.01); *G11C 19/28* (2013.01)

(58) Field of Classification Search
CPC ......... G09G 3/2092; G09G 2310/0286; G09G 2310/061; G09G 2310/08; G09G 2310/0267; G09G 3/3266; G11C 19/28
See application file for complete search history.

(56) References Cited

U.S. PATENT DOCUMENTS

2006/0279511 A1* 12/2006 Uh ......................... G11C 19/28
345/100
2011/0007863 A1   1/2011 Tsai et al.
(Continued)

FOREIGN PATENT DOCUMENTS

CN         1767070 A     5/2006
CN       104299583 A     1/2015
(Continued)

OTHER PUBLICATIONS

CN201910815443.9 first office action.

*Primary Examiner* — Jose R Soto Lopez
(74) *Attorney, Agent, or Firm* — Ipro, PLLC

(57) ABSTRACT

A shift register comprises a first shift register unit and a second shift register unit. The first shift register unit comprises a first input circuit connected to a first input terminal and a first pull-up node, a first output circuit connected to the first pull-up node, a first output terminal and a first clock terminal, a first pull-down circuit and a unidirectional isolation circuit, and the first output terminal is connected to the first pull-down circuit by the unidirectional isolation circuit. The second shift register unit comprises a second input circuit connected to a second input terminal and a second pull-up node, and a second output circuit connected to the second pull-up node, a second output terminal and a second (Continued)

clock signal, and the second output terminal is connected to a node between the first pull-down circuit and the unidirectional isolation circuit.

19 Claims, 7 Drawing Sheets

(56) References Cited

U.S. PATENT DOCUMENTS

| | | |
|---|---|---|
| 2011/0069806 A1 | 3/2011 | Liao et al. |
| 2012/0105398 A1* | 5/2012 | Park .............. H03K 19/018521 345/206 |
| 2012/0155604 A1* | 6/2012 | Yang ................... G11C 19/287 377/79 |
| 2012/0163528 A1* | 6/2012 | Jang ..................... G09G 3/3688 377/64 |
| 2012/0181539 A1* | 7/2012 | Han .................... H01L 27/0288 257/E29.273 |
| 2012/0212275 A1* | 8/2012 | Jang ....................... G11C 19/28 327/295 |
| 2012/0235983 A1* | 9/2012 | Sakamoto ............ G09G 3/3677 345/212 |
| 2012/0269316 A1* | 10/2012 | Jang ....................... G11C 19/28 377/64 |
| 2013/0010916 A1* | 1/2013 | Jang .................... G09G 3/3677 377/64 |
| 2013/0038587 A1* | 2/2013 | Song ........................ G09G 3/20 345/204 |
| 2013/0148775 A1* | 6/2013 | Shin ........................ G11C 19/28 377/69 |
| 2014/0061612 A1 | 3/2014 | Yamazaki et al. |
| 2015/0187323 A1* | 7/2015 | Jin ....................... G09G 3/2092 345/215 |
| 2016/0027526 A1* | 1/2016 | Xu ........................ G09G 3/2096 377/64 |
| 2016/0093264 A1* | 3/2016 | Gu ........................ G11C 19/28 345/212 |
| 2016/0133185 A1* | 5/2016 | Yoon ..................... G09G 3/3233 345/76 |
| 2016/0189794 A1* | 6/2016 | Lou ...................... G09G 3/3266 345/100 |
| 2016/0224175 A1* | 8/2016 | Moon .................... G06F 3/0412 |
| 2016/0253975 A1* | 9/2016 | Yang ..................... G09G 3/3677 345/58 |
| 2016/0266700 A1* | 9/2016 | Ji ........................... G09G 3/3674 |
| 2016/0293091 A1* | 10/2016 | Wang .................... G09G 3/2092 |
| 2017/0039969 A1* | 2/2017 | Wang .................... G09G 3/3677 |
| 2017/0092212 A1 | 3/2017 | Wang |
| 2017/0116921 A1* | 4/2017 | Xiao ....................... G11C 19/28 |
| 2017/0178584 A1* | 6/2017 | Ma ........................ G09G 3/3696 |
| 2017/0186393 A1* | 6/2017 | Wang ................... G11C 19/287 |
| 2017/0193945 A1* | 7/2017 | Feng .................... G09G 3/3677 |
| 2017/0270886 A1 | 9/2017 | Yu |
| 2017/0309243 A1* | 10/2017 | He ........................ G09G 3/3648 |
| 2018/0075923 A1* | 3/2018 | Ma ......................... G11C 19/28 |
| 2018/0090072 A1* | 3/2018 | Sun ...................... G09G 3/3258 |
| 2018/0108426 A1* | 4/2018 | Zheng ................... G09G 3/3677 |
| 2018/0181244 A1* | 6/2018 | Sato ..................... G09G 3/3677 |
| 2018/0190179 A1 | 7/2018 | Zhao |
| 2018/0190180 A1* | 7/2018 | Shang ................... G11C 19/28 |
| 2019/0080780 A1* | 3/2019 | Wang .................... G11C 19/28 |
| 2019/0155433 A1* | 5/2019 | Park ..................... G06F 3/04184 |
| 2019/0164498 A1* | 5/2019 | Jang ........................ G09G 3/32 |
| 2019/0206303 A1* | 7/2019 | Hwang ................. G11C 19/28 |
| 2019/0287447 A1* | 9/2019 | Zheng ................... G11C 19/28 |
| 2019/0378463 A1* | 12/2019 | Chung ................. G09G 3/3225 |
| 2019/0392915 A1* | 12/2019 | Zhu ...................... G09G 3/3674 |
| 2020/0074951 A1 | 3/2020 | Lu et al. |
| 2020/0168285 A1* | 5/2020 | Chen ..................... G11C 19/28 |
| 2020/0243032 A1* | 7/2020 | Gu .......................... G11C 7/02 |
| 2021/0142713 A1 | 5/2021 | Feng et al. |
| 2021/0201774 A1* | 7/2021 | Feng ..................... G09G 3/3225 |
| 2021/0375211 A1 | 12/2021 | Feng et al. |

FOREIGN PATENT DOCUMENTS

| | | |
|---|---|---|
| CN | 104700789 A | 6/2015 |
| CN | 105118418 A | 12/2015 |
| CN | 105931595 A | 9/2016 |
| CN | 106297636 A | 1/2017 |
| CN | 106297698 A | 1/2017 |
| CN | 107799088 A | 3/2018 |
| CN | 109064986 A | 12/2018 |
| CN | 109935209 A | 6/2019 |
| CN | 109935269 A | 6/2019 |
| JP | 5752216 B2 | 7/2015 |

* cited by examiner

SHIFT REGISTER AND DRIVING METHOD THEREFOR, GATE DRIVING CIRCUIT, AND DISPLAY PANEL

The application claims priority to Chinese Patent Application No. 201910815443.9, filed with the China National Intellectual Property Administration on Aug. 30, 2019, which is incorporated herein by reference in its entirety.

TECHNICAL FIELD

The disclosure relates to the technical field of display, in particular to a shift register, a drive method thereof, a gate drive circuit, and a display panel.

BACKGROUND

An OLED gate drive circuit in the related art typically consists of three sub-circuits, namely a detection unit, a display unit, and a connection unit for outputting complex pulses of the detection unit and the display unit (or a gate circuit or a Hiz circuit).

SUMMARY

The embodiments of the disclosure provide a shift register which comprises: a first shift register unit, wherein the first shift register unit comprises a first input circuit, a first output circuit, a first pull-down circuit and a unidirectional isolation circuit, the first input circuit is connected to a first input terminal and a first pull-up node and is configured to supply a first input signal input by the first input terminal to the first pull-up node, the first output circuit is connected to the first pull-up node, a first output terminal and a first clock terminal and is configured to control the first output terminal to output a first output signal according to a potential of the first pull-up node and a first clock signal of the first clock terminal, the first output terminal is connected to the first pull-down circuit by means of the unidirectional isolation circuit, and the unidirectional isolation circuit is configured to be turned on or off under the control of the first output signal output by the first output terminal; and a second shift register unit, wherein the second shift register unit comprises a second input circuit and a second output circuit, the second input circuit is connected to a second input terminal and a second pull-up node and is configured to supply a second input signal input by the second input terminal to the second pull-up node, the second output circuit is connected to the second pull-up node, a second output terminal and a second clock signal and is configured to control the second output terminal to output a second output signal according to a potential of the second pull-up node and a second clock signal of the second clock terminal, and the second output terminal is connected to a node between the first pull-down circuit and the unidirectional isolation circuit.

For example, the first shift register unit further comprises a first control circuit, wherein the first control circuit is connected to the first pull-up node, a first pull-down node, a first power signal terminal and a first reference signal terminal, and the first control circuit is configured to control a potential of the first pull-down node based on a potential of the first power signal terminal and a potential of the first reference signal terminal under the control of the first pull-up node;

the second shift register unit further comprises a second control circuit, wherein the second control circuit is connected to the second pull-up node, a second pull-down node, a second power signal terminal and the first reference signal terminal, and the second control circuit is configured to control a potential of the second pull-down node based on a potential of the second power terminal and the potential of the first reference signal terminal under the control of the second pull-up node;

wherein, the first pull-down circuit is connected to the first pull-down node and the second pull-down node and is configured to pull down a potential of the node between the first pull-down circuit and the unidirectional isolation circuit under the control of the first pull-down node and the second pull-down node.

For example, the first shift register unit further comprises a second pull-down circuit, and the second pull-down circuit is connected to the first pull-up node, the first pull-down node and the second pull-down node, and the second pull-down circuit is configured to pull down the potential of the first pull-up node under the control of the first pull-down node or the second pull-down node.

For example, the second shift register unit further comprises a third pull-down circuit, and the third pull-down circuit is connected to the second pull-up node, the first pull-down node and the second pull-down node, and the third pull-down circuit is configured to pull down the potential of the second pull-up node under the control of the first pull-down node and the second pull-down node.

For example, the potential of the first power signal terminal and the potential of the second power signal terminal are opposite in phase.

For example, the first shift register unit further comprises a cascade output circuit and a fourth pull-down circuit, the cascade output circuit is connected to a third clock terminal, the first pull-up node and a cascade output terminal, and the cascade output circuit is configured to control the cascade output terminal to output a cascade output signal according to the potential of the first pull-up node and a third clock signal of the third clock terminal, and the fourth pull-down circuit is connected to the cascade output terminal, the first pull-down node and the second pull-down node, and the fourth pull-down circuit is configured to pull down a potential of the cascade output terminal under the control of the first pull-down node and the second pull-down node.

For example, the first shift register unit further comprises a first reset circuit, and the first reset circuit is connected to the first pull-up node, the first reference signal terminal and a first reset terminal, and the first reset circuit is configured to reset the first pull-up node to the potential of the first reference signal terminal under the control of the first reset terminal; and the second shift register unit further comprises a second reset circuit, and the second reset circuit is connected to the second pull-up node, the first reference signal terminal and a second reset terminal, and the second reset circuit is configured to reset the second pull-up node to the potential of the first reference signal under the control of the second reset terminal.

For example, the first pull-down circuit comprises a first transistor and a second transistor, a first pole of the first transistor and a first pole of the second transistor are connected to the unidirectional isolation circuit and the second output terminal, a second pole of the first transistor and a second pole of the second transistor are connected to the first reference signal terminal, a control pole of the first transistor is connected to the first pull-down node, and a control pole of the second transistor is connected to the second pull-down node.

For example, the unidirectional isolation circuit comprises a third transistor, a first pole and a control pole of the third transistor are connected to the first output terminal of the first shift register unit, and a second pole of the third transistor is connected to the first pull-down circuit and the second output terminal.

For example, the second pull-down circuit comprises a seventh transistor and an eighth transistor, a first pole of the seventh transistor and a first pole of the eighth transistor are connected to the first pull-up node, a second pole of the seventh transistor and a second pole of the eighth transistor are connected to the first reference signal terminal, a control pole of the seventh transistor is connected to the first pull-down node, and a control pole of the eighth transistor is connected to the second pull-down node.

For example, the third pull-down circuit comprises a ninth transistor and a tenth transistor, a first pole of the ninth transistor and a first pole of the tenth transistor are connected to the second pull-up node, a second pole of the ninth transistor and a second pole of the tenth transistor are connected to the first reference signal terminal, a control pole of the ninth transistor is connected to the first pull-down node, and a control pole of the tenth transistor is connected to the second pull-down node.

For example, the fourth pull-down circuit comprises an eleventh transistor and a twelfth transistor, a first pole of the eleventh transistor and a first pole of the twelfth transistor are connected to the cascade output terminal, a second pole of the eleventh transistor and a second pole of the twelfth transistor are connected to the first reference signal terminal, a control pole of the eleventh transistor is connected to the first pull-down node, and a control pole of the twelfth transistor is connected to the second pull-down node.

The embodiments of the disclosure further provide a gate drive circuit, comprising the above shift registers.

The embodiments of the disclosure further provide a display panel, the display panel comprises the above gate drive circuit.

The embodiments of the disclosure further provide a drive method for the above shift register, the method comprises:

supplying, by the first input circuit, a first input signal input by the first input terminal to the first pull-up node, controlling, by the first output circuit, the first output terminal of the first shift register unit to output a first output signal of a first level according to the potential of the first pull-up node and the first clock signal of the first clock terminal, enabling, by the potential of the first output terminal and the potential of the second output terminal, the unidirectional isolation circuit to be turned on to control the second output terminal of the second shift register unit to output a second output signal of the first level; and supplying, by the second input circuit, a second input signal input by the second input terminal to the second pull-up node, and controlling, by the second output circuit, the second output terminal to keep outputting the second output signal of the first level according to the potential of the second pull-up node and the second clock signal of the second clock terminal.

For example, the first shift register unit further comprises the first control circuit and the first reset circuit, and the second shift register unit further comprises the second control circuit and the second reset circuit, and the method further comprises:

reset, by the first reset circuit, the first pull-up node under the control of the first reset terminal, and reset, by the second reset circuit, the second pull-up node under the control of the second reset terminal;

enabling, by the potential of the first pull-up node, the first control circuit to write the potential of the first power signal terminal into the first pull-down node, and enabling, by the potential of the second pull-up node, the second control circuit to write the potential of the second power signal terminal into the second pull-down node; and pulling down the first output terminal and the second output terminal by the first pull-down circuit under the control of the first pull-down node and the second pull-down node.

BRIEF DESCRIPTION OF THE DRAWINGS

The embodiments of the disclosure will be described below in conjunction with the accompanying drawings to make the above and/or other aspects and advantages of the disclosure obvious and easily understood, wherein.

DETAILED DESCRIPTION

The embodiments of the disclosure will be described in detail below, and examples of the embodiments are illustrated by the accompanying drawings, in which identical or similar reference signs represent identical or similar elements, or elements with identical or similar functions throughout the specification. The embodiments described below with reference to the accompanying drawings are merely illustrative ones for explaining the disclosure, and should not be construed as limitations of the disclosure.

The embodiments of the disclosure provide a shift register, a drive method thereof, a gate drive circuit, and a display panel, which will be described below with reference to the accompanying drawings.

Figure 1:
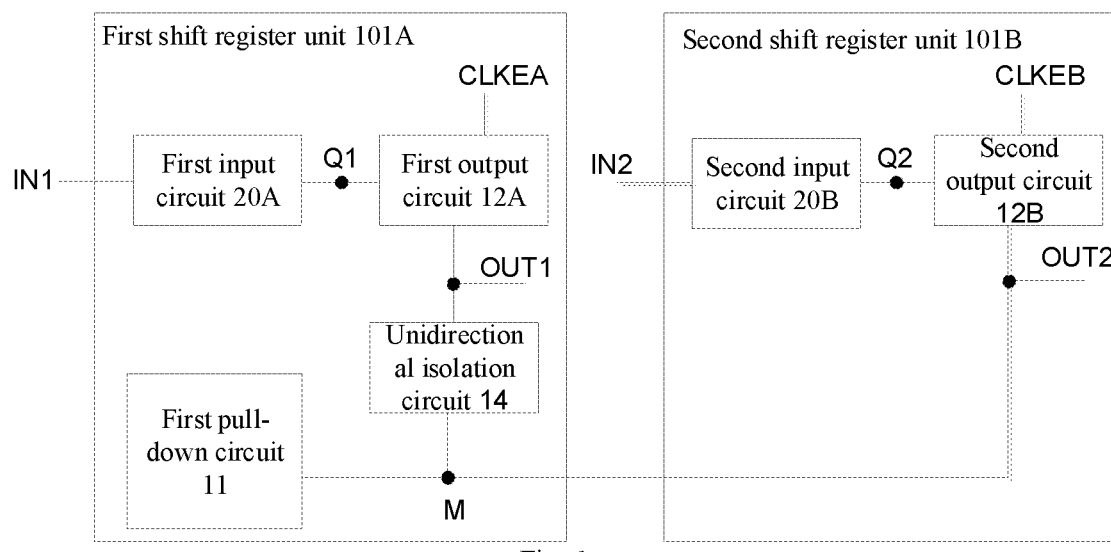
FIG. 1 is a block diagram of a shift register according to the embodiments of the disclosure.

FIG. 1 is a block diagram of a shift register according to the embodiments of the disclosure. As shown in FIG. 1, the shift register comprises a first shift register unit 101A and a second shift register unit 101B, wherein the first shift register unit 101A and the second shift register unit 101B share a first pull-down circuit 11.

The first shift register unit 101A comprises the first pull-down circuit 11 and a first output circuit 12A. The first output circuit 12A is connected to a first pull-up node Q1, a first output terminal OUT1 and a first clock terminal CLKEA, and the first output terminal OUT1 is connected to the first pull-down circuit 11 by means of a unidirectional isolation circuit 14. The first output circuit 12A is able to control the first output terminal OUT1 to output a first output signal according to a potential of the first pull-up node Q1 and a first clock signal of the first clock terminal CLKE. The second shift register unit 101B comprises a second output circuit 12B connected to a second pull-up node Q2, a second output terminal OUT2 and a second clock terminal CLKEB, and the second output terminal OUT2 is connected to the first pull-down circuit 11. The second output circuit 12B is able to control the second output terminal OUT2 to output a second output signal according to a potential of the second pull-up node Q1 and a second clock signal of the second clock terminal CLKEB. For example, the second output circuit 12B is able to output the second output signal synchronously by means of the second output terminal OUT2 when the first output terminal OUT1 outputs the first output signal, and is able to control the second output terminal OUT2 to keep outputting the second output signal according to the potential of the second pull-up node Q2 and the second clock signal of the second clock terminal CLKEB.

The first shift register unit 101A further comprises a first input circuit 20A, wherein the first input circuit 20A is connected to the first pull-up node Q1 and a first input terminal IN1 and is able to supply a first input signal input by the first input terminal IN1 to the first pull-up node Q1.

The second shift register unit 101B further comprises a second input circuit 20B, wherein the second input circuit 20B is connected to a second input terminal IN2 and the second pull-up node Q2 and is able to supply a second input signal input by the second input terminal IN2 to the second pull-up node Q2.

The unidirectional isolation circuit 14 may be turned on or off under the control of potentials of the first output terminal OUT1 and the second output terminal OUT2 to realize unidirectional conduction. For example, a node M2 is configured between the two shift register units and the first pull-down circuit 11; when the potential of the first output terminal OUT1 is higher than a potential of the node M, the unidirectional isolation circuit 14 is turned on; or, when the potential of the first output terminal OUT1 is lower than the potential of the node M, the unidirectional isolation circuit 14 is turned off.

It should be noted that multiple shift registers 100 constitute a gate drive circuit GOA, wherein the two shift register units in each shift register may be located at different levels (or rows), that is, the two shift register units correspondingly drive multiple rows of pixels in a pixel circuit, respectively. As an example, the two shift register units in each shift register 100 are located at an odd level and an even level respectively, that is, the two shift register units correspondingly drive an odd row of pixels and an even row of pixels in the pixel circuit, respectively.

It can be understood that, in the embodiments of the disclosure, the first output terminal OUT1 of the first shift register unit 101A may be controlled to output the first output signal according to the potential of the first pull-up node Q1 and the first clock signal of the first clock terminal CLKEA; when the first output terminal OUT1 outputs the first output signal, the second output terminal OUT2 of the second shift register unit 101B outputs the second output signal synchronously, and is controlled to keep outputting the second output signal according to the potential of the second pull-up node Q2 and the second clock signal of the second clock terminal CLKEB. In addition, after the signals are output by the two shift register units, the first pull-down circuit 11 may be controlled to synchronously pull down the first output terminal OUT1 and the second output terminal OUT2, that is, the first pull-down circuit 11 synchronously pulls the first output terminal OUT1 and the second output terminal OUT2 down to a low potential.

For example, when the first pull-up node Q1 is at a high potential and the first clock signal provided by the first clock terminal CLKE is a high potential, the first output circuit 12A of the first shift register unit 101A is turned on, and the high potential provided by the first clock terminal CLKEA enables the first output terminal OUT1 of the first shift register unit 101A to output a high potential. When the first output terminal OUT1 outputs the first output signal, the first output terminal OUT1 is not isolated from the second output terminal OUT2, so that the second output terminal OUT2 and the first output terminal OUT1 synchronously output the high potential. Next, when the second pull-up node Q2 is at a high potential and the second clock signal provided by the second clock terminal CLKEB is a high potential, the second output circuit 12B of the second shift register unit 101B is turned on, and the high potential provided by the second clock terminal CLKEB enables the second output terminal OUT2 of the second shift register unit 101B to output a high potential.

Thus, according to the shift register provided by the embodiments of the disclosure, the first pull-down circuit 11 is shared, so that the circuit structure is simplified, less space is occupied, and the requirements for high resolution and narrow frame are met.

It should be noted that "high potential" and "low potential" in this specification refer to two logic states, represented by potential ranges, of a certain circuit node. For example, the high potential of the first pull-up node Q1 may specifically refer to a potential higher than the potential of a common terminal voltage, and the low potential of the first pull-up node Q1 may specifically refer to a potential lower than the potential of the common terminal voltage. It may be understood that the specific potential range may be set in specific application scenarios as required, and the disclosure has no limitation in this aspect.

Correspondingly, "pull-up" in this specification refers to increasing the potential of a corresponding circuit node to a high potential, "pull-down" in this specification refers to decreasing the potential of the corresponding circuit node to a low potential. It can be understood that both "pull-up" and "pull-down" may be realized by directional migration of electric charges, and may be specifically implemented by electronic elements with corresponding functions or combinations thereof. The disclosure has no limitation in this aspect.

Figure 2:
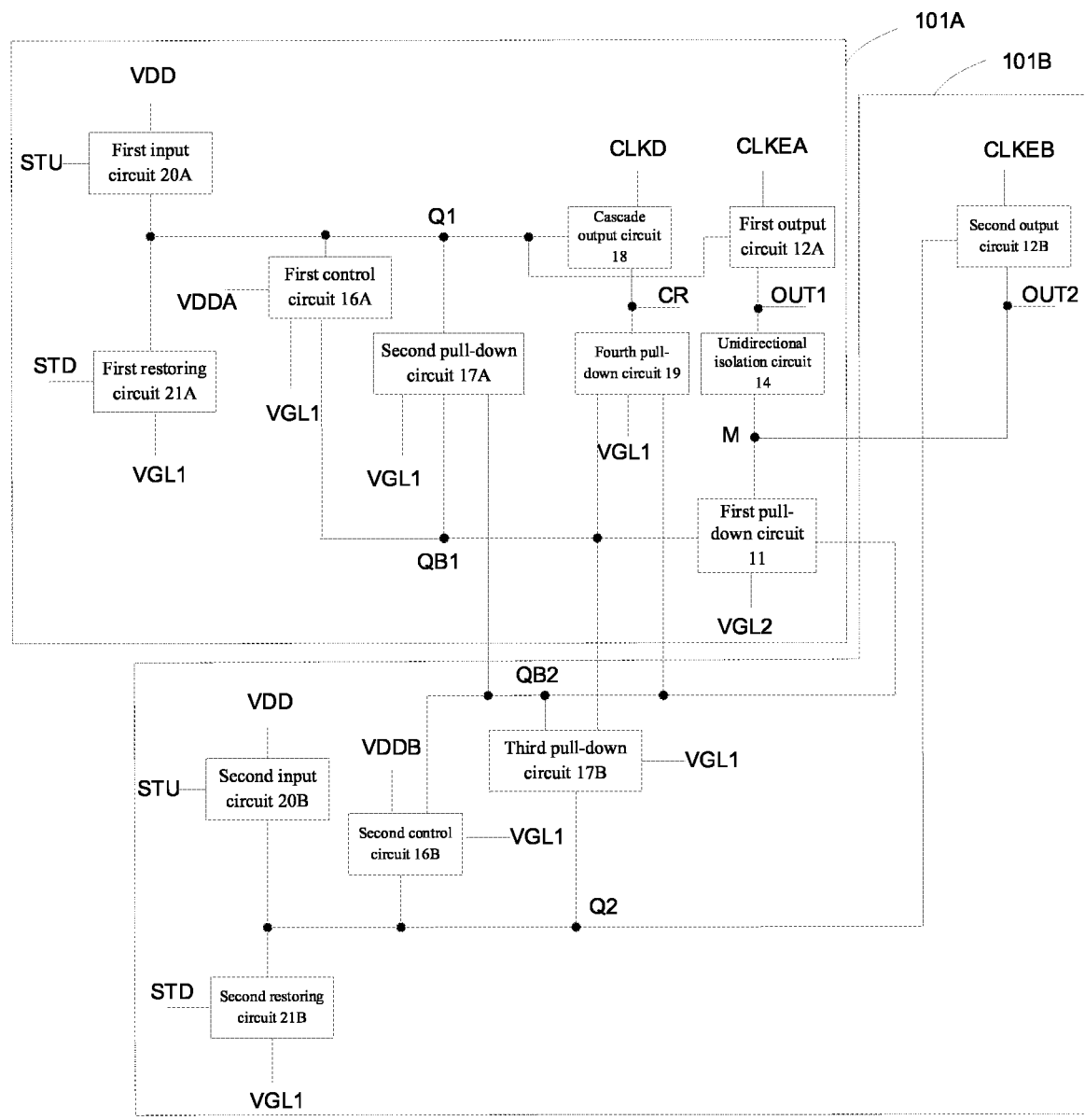
FIG. 2 is a block diagram of the shift register according to one embodiment of the disclosure.

Furthermore, as shown in FIG. 2, the first shift register unit 101A further comprises a first control circuit 16A connected to the first pull-up node Q1, a first pull-down node QB1, a first power source (a first power signal terminal) VDDA and a third power source (a first reference signal terminal) VGL1. The first control circuit 16A is able to control a potential of the first pull-down node QB1 based on potentials of the first power signal terminal VDDA and the first reference signal terminal VGL1 under the control of the first pull-up node Q1. For example, the first control circuit 16A is able to write the potential of the first power source VDDA into the first pull-down node QB1, or is able to pull the potential of the first pull-down node QB1 down to the potential of the third power source VGL1 under the control of the first pull-up node Q1. The second shift register unit 101B further comprises a second control circuit 16B connected to the second pull-up node Q2, a second pull-down node QB2, a second power source (a second power signal terminal) VDDB and the third power source VGL1. The second control circuit 16B is able to control a potential of the second pull-down node QB2 based on potentials of the second power terminal VDDB and the first reference signal terminal VGL1 under the control of the second pull-up node Q2. For example, the second control circuit 16B is able to write the potential of the second power source VDDB into the second pull-down node QB2, or is able to pull the potential of the second pull-down node Q2 down to the potential of the third power source VGL1 under the control of the second pull-up node Q2. A first control terminal of the first pull-down circuit 11 is connected to the first pull-down node QB1, and a second control terminal of the first pull-down circuit 11 is connected to the second pull-down node QB2. The first pull-down circuit 11 is able to pull down the potential of the node M under the control of the first pull-down node QB1 and the second pull-down node QB2.

It should be noted that the first power source VDDA and the second power source VDDB may operate alternately to enable the potential of the first power signal terminal and the potential of the second power signal terminal to be opposite in phase. That is, only one of the first power source VDDA and the second power source VDDB operates at the same moment. For example, when the first power source VDDA provides a high potential, the second power source VDDB provides a low potential; or, when the first power source VDDA provides a low potential, the second power source VDDB provides a high potential. In addition, the third power source VGL1 may provide a low potential.

It may be understood that, as an example, when the first power source VDDA provides a high potential, the potential of the first power source VDDA is written into the first pull-down node QB1; and when the first pull-up node Q1 is at a high potential, the first control circuit 16A is able to pull down the potential of the first pull-down node QB1 by means of the third power source VGL1, that is, the potential of the first pull-down node QB1 is pulled down to the potential of the third power source VGL1 (a low potential). When the first pull-up node Q1 is at a low potential, the first control circuit 16A stops pulling down the potential of the first pull-down node QB1, that is, the potential of the first pull-down node QB1 is held at the potential of the first power source VDDA (a high potential). At this moment, the second power source VDDB provides a low potential, so the second pull-down node QB2 is always at a low potential.

Similarly, for example, when the second power source VDDB provides a high potential, the potential of the second power source VDDB is written into the second pull-down node QB2; and when the second pull-up node Q2 is at a high potential, the second control circuit 16B is able to pull down the potential of the second pull-down node QB2 by means of the third power source VGL1, that is, the potential of the second pull-down node QB2 is pulled down to the potential of the third power source VGL1 (a low potential). When the second pull-up node Q2 is at a low potential, the second control circuit 16B stops pulling down the potential of the second pull-down node QB2, that is, the potential of the second pull-down node QB2 is held at the potential of the second power source VDDB (a high potential). At this moment, the first power source VDDA provides a low potential, so the first pull-down node QB1 is always at a low potential.

Furthermore, as shown in FIG. 2, the first shift register unit 101A further comprises a second pull-down circuit 17A, wherein the second pull-down circuit 17A is connected to the first pull-up node Q1, the first pull-down node QB1 and a second pull-down node QB2 and is used to pull down the potential of the first pull-up node Q1 under the control of the first pull-down node QB1 or the second pull-down node QB2 to initialize the first pull-up node Q1. The second shift register unit 101B further comprises a third pull-down circuit 17B, wherein the third pull-down circuit 17B is connected to the second pull-up node Q2, the first pull-down node QB1 and the second pull-down node QB2 and is used to pull down the potential of the second pull-up node Q2 under the control of the first pull-down node QB1 or the second pull-down node QB2 to initialize the second pull-up node Q2.

It may be understood that when the first pull-down node QB1 or the second pull-down node QB2 is at a high potential, the second pull-down circuit 17A of the first shift register unit 101A is turned on to initialize the first pull-up node Q1, that is, the potential of the first pull-up node Q1 is pulled down to the potential of the third power source VGL1 (a low potential). Similarly, when the first pull-down node QB1 or the second pull-down node QB2 is at a high potential, the third pull-down circuit 17B of the second shift register unit 101B is turned on to initialize the second pull-up node Q2, that is, the potential of the second pull-up node Q2 is pulled down to the potential of the third power source VGL1 (a low potential).

Furthermore, as shown in FIG. 2, the first shift register unit 101A further comprises a cascade output circuit 18 and a fourth pull-down circuit 19. The cascade output circuit 18 is connected to a third clock terminal CLKD, the first pull-up node Q1 and a cascade output terminal CR, and is used to control the cascade output terminal CR to output a cascade output signal according to the potential of the first pull-up node Q1 and a third clock signal of the third clock terminal CLKD. The fourth pull-down circuit 19 is connected to the cascade output terminal CR, has a first control terminal connected to the first pull-down node QB1 and a second control terminal connected to the second pull-down node QB2, and is used to pull down the potential of the cascade output terminal CR under the control of the first pull-down node QB1 or the second pull-down node QB2.

It may be understood that when the first pull-up node Q1 is at a high potential and the third clock signal provided by the third clock terminal CLKD is a high potential, the cascade output circuit 18 of the first shift register unit 101A is turned on, and the high potential provided by the third clock terminal CLKD enables the cascade output terminal CR of the first shift register unit 101A to output a high potential. In addition, when the first pull-down node QB1 or the second pull-down node QB2 is at a high potential, the third pull-down circuit 19 of the first shift register unit 101A is turned on to pull down the cascade output terminal CR, that is, the potential of the cascade output terminal CR is pulled down to the potential of the third power source VGL1 (a low potential).

Furthermore, as shown in FIG. 2, the first shift register unit 101A further comprises a first input circuit 10A, wherein the first input circuit 10A is connected to the first pull-up node Q1, a fourth source VDD and a first input terminal (a first control terminal STU in FIG. 2) and is used to write a potential provided by the fourth power source (a third power signal terminal) VDD into the first pull-up node Q1 under the control of the first control terminal STU. In some embodiments, as shown in FIG. 2, the first shift register unit 101A further comprises a first reset circuit 21A, wherein the first reset circuit 21A is connected to the first pull-up node Q1, the third power source VGL1 and a first reset terminal (a second control terminal STD in FIG. 2) and is used to reset the first pull-up node Q1 by means of the third power source VGL1 under the control of the second control terminal STD. The second shift register unit 101B further comprises a second input circuit 20B, wherein the second input circuit 20B is connected to the second pull-up node Q2, the fourth power source VDD and a second input terminal (a first control terminal STU in FIG. 2) and is used to write the potential provided by the fourth power source VDD into the second pull-up node Q2 under the control of the first control terminal STU. The second shift register unit 101B further comprises a second reset circuit 21B, wherein the second reset circuit 21B is connected to the second pull-up node Q2, the third power source VGL1 and a second reset terminal (a second control terminal STD in FIG. 2) and is used to reset the second pull-up node Q2 by means of the third power source VGL1 under the control of the second control terminal STD.

It may be understood that when the first control terminal STU is at a high potential, the first input circuit 20A of the first shift register unit 101A is turned on to write a high potential provided by the fourth power source VDD into the first pull-up node Q1, and the second input circuit 20B of the second shift register unit 101B is turned on to write the high potential provided by the fourth power source VDD into the second pull-up node Q2. In addition, when the second control terminal STD is at a high potential, the first reset circuit 21A of the first shift register unit 101A is turned on to reset the first pull-up node Q1 by means of the third power source VGL1, that is, the potential of the first pull-up node Q1 is pulled down to the potential of the third power source VGL1 (a low potential); and the second reset circuit 21B of the second shift register unit 101B is turned on to reset the second pull-up node Q2 by means of the third power source VGL1, that is, the potential of the second pull-up node Q2 is pulled down to the potential of the third power source VGL1 (a low potential).

Figure 3:
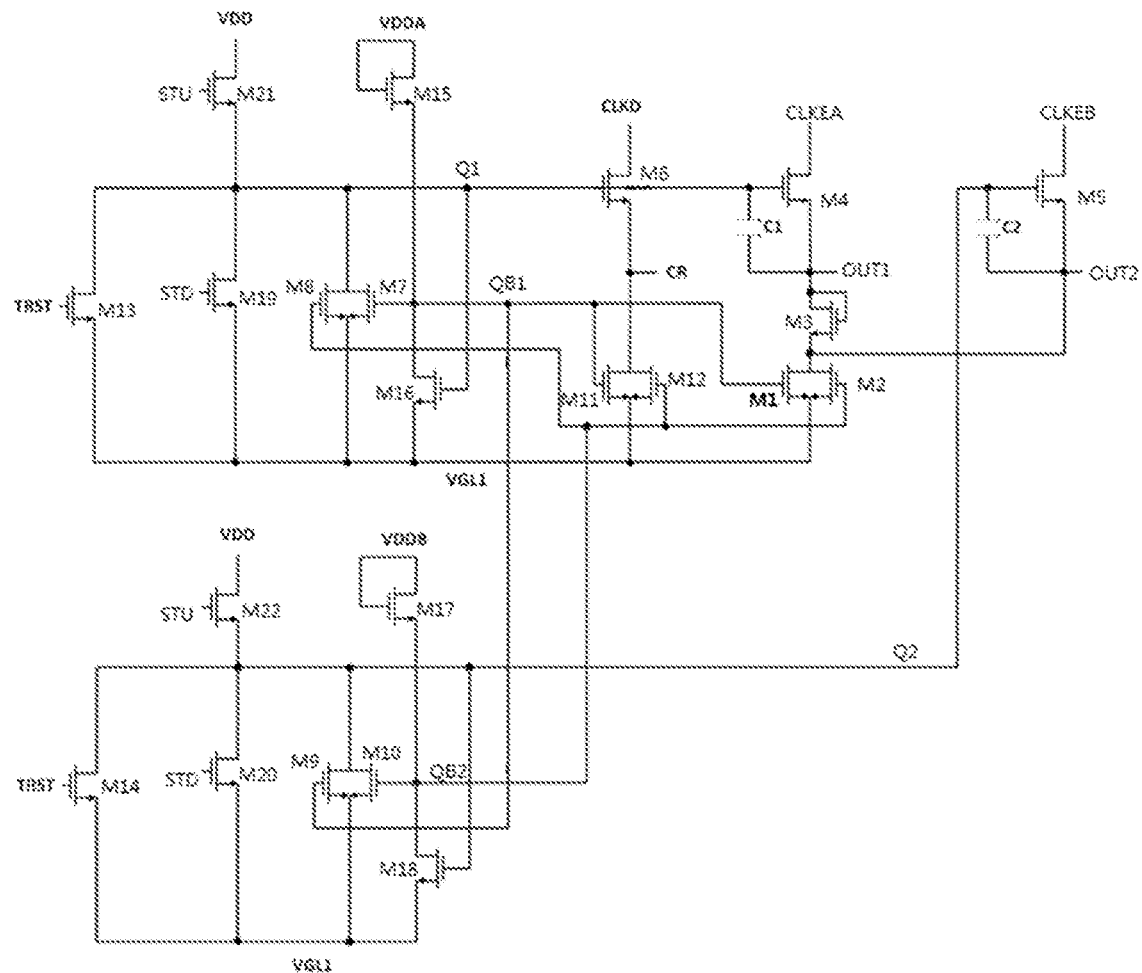
FIG. 3 is a circuit diagram of the shift register according to one embodiment of the disclosure.

FIG. 3 is a circuit diagram of the shift register according to one embodiment of the disclosure. In the following embodiment, a control pole of transistors may be a gate, a first pole of the transistors may be a collector, and a second pole of the transistors may be an emitter. The transistors may be N-type transistors or P-type transistors, and the application is described with the N-type transistors as an example. Obviously, those ordinarily skilled in the art may apply the application to the case of P-type transistors with reference to the technical concept of the application after reading the specification of the application. As an example, the transistors may be thin-film transistors TFT.

According to the embodiment illustrated by FIG. 3, the first pull-down circuit 11 comprises a first transistor M1 and a second transistor M2, wherein a first pole of the first transistor M1 is connected to a first pole of the second transistor M2 and is also connected to the unidirectional isolation circuit 14 and the second output terminal OUT2, a second pole of the first transistor M1 is connected to a second pole of the second transistor M2 and is also connected to a fifth power source (a second reference signal terminal) VGL2, a control pole of the first transistor M1 is connected to the first pull-down node QB1, and a control pole of the second transistor M2 is connected to the second pull-down node QB2.

It should be noted that the fifth power source VGL2 and the third power source VGL1 may be DC low potential signals, the values of which may be identical or different. Optionally, the potential of the fifth power source VGL2 is higher than the potential of the third power source VGL1. Wherein, the potential of the fifth power source VGL2 and the potential of the third power source VGL1 may be both negative potentials. The third power source VDD may be a DC high potential signal.

It may be understood that when the first pull-down node QB1 is at a high level, the first transistor M1 is turned on. In this application, the unidirectional isolation circuit 14 may be unidirectionally turned on from the terminal connected to the first output terminal OUT1 to the terminal connected to the first pull-down circuit 11, so that when the first transistor M1 is turned on, the first output terminal OUT1 will be pulled down by the unidirectional isolation circuit 14, the second output terminal OUT2 will also be pulled down, and thus, the potential of the first output terminal OUT1 and the potential of the second output terminal OUT2 are pulled down to the low potential provided by the third power source VGL1.

According to the shift register provided by the embodiments of the disclosure, the first pull-down circuit is shared, so that the circuit structure is simplified, less space is occupied, and the requirements for high resolution and narrow frame are met.

According to one embodiment of the disclosure, as shown in FIG. 3, the unidirectional isolation circuit 14 comprises a third transistor M3, wherein a first pole of the third transistor M3 is connected to a control pole and is also connected to the first output terminal OUT1 of the corresponding shift register unit 101, and a second pole of the third transistor M3 is connected to the first pull-down circuit 11 and the second output terminal OUT2.

It may be understood that the first pole of the third transistor M3 is connected to the control pole, so that the third transistor M3 is connected in the form of a diode; and the second pole of the third transistor M3 is connected to the common node M that is connected to the first pull-down circuit 11 and the second output terminal OUT2. Specifically, when the second output terminal OUT2 is at a high level, the unidirectional isolation circuit 14 is turned off reversely, so that the output signal output by the first output terminal OUT1 will not be influenced by the second output terminal OUT2. However, when the first output terminal OUT1 is at a high level, the unidirectional isolation circuit 14 is unidirectionally turned on, so that the output signal output by the second output terminal OUT2 will be influenced by the first output terminal OUT1.

According to one embodiment of the disclosure, as shown in FIG. 3, the second pull-down circuit 17A comprises a seventh transistor M7 and an eighth transistor M8, wherein a first pole of the seventh transistor M7 is connected to a first pole of the eighth transistor M8 and is also connected to the first pull-up node Q1, a second pole of the seventh transistor M7 is connected to a second pole of the eighth transistor M8 and is also connected to the third power source VGL1, a control pole of the seventh transistor M7 is connected to the first pull-down node QB1, and a control pole of the eighth transistor M8 is connected to the second pull-down node QB2; the third pull-down circuit 17B comprises a ninth transistor M9 and a tenth transistor M10, wherein a first pole of the ninth transistor M9 is connected to a first pole of the tenth transistor M10 and is also connected to the second pull-up node Q2, a second pole of the ninth transistor M9 is connected to a second pole of the tenth transistor M10 and is also connected to the third power source VGL1, a control pole of the ninth transistor M9 is connected to the first pull-down node QB1, and a control pole of the tenth transistor M10 is connected to the second pull-down node QB2.

It may be understood that when the first pull-down node QB1 is at a high potential, the seventh transistor M7 is turned on, the potential of the first pull-up node Q1 may be pulled by the seventh transistor M7 down to the low potential provided by the third power source VGL1; and the ninth transistor M9 is turned on, and the potential of the second pull-up node Q2 may be pulled by the ninth transistor M9 down to the low potential provided by the third power source VGL1. When the second pull-down node QB2 is at a high potential, the eighth transistor M8 is turned on, and the potential of the first pull-up node Q1 may be pulled by the eighth transistor M8 down to the low potential provided by the third power source VGL1; and the tenth transistor M10 is turned on, and the potential of the second pull-up node Q2 may be pulled by the tenth transistor M10 down to the low potential provided by the third power source VGL1.

According to the embodiment illustrated by FIG. 3, the third pull-down circuit 19 comprises an eleventh transistor M11 and a twelfth transistor M12, wherein a first pole of the eleventh transistor M11 is connected to a first pole of the twelfth transistor M12 and is also connected to the cascade output terminal CR, a second pole of the eleventh transistor M11 is connected to a second pole of the twelfth transistor M12 and is also connected to the third power source VGL1, a control pole of the eleventh transistor M11 is connected to the first pull-down node QB1, and a control pole of the twelfth transistor M12 is connected to the second pull-down node QB2.

It may be understood that when the first pull-down node QB1 is at a high potential, the eleventh transistor M11 is turned on, and the potential of the cascade output terminal CR may be pulled by the eleventh transistor M11 down to the low potential provided by the third power source VGL1. When the second pull-down node QB2 is at a high potential, the twelfth transistor M12 is turned on, and the potential of the cascade output CR may be pulled by the twelfth transistor M12 down to the low potential provided by the third power source VGL1.

According to the embodiment illustrated by FIG. 3, the first output circuit 12A of the first shift register unit 101A comprises a fourth transistor M4 and a first capacitor C1, wherein a first pole of the fourth transistor M4 is connected to the first clock terminal CLKEA, a second pole of the fourth transistor M4 is connected to the first output terminal OUT1 of the first shift register unit 101A, and a control pole of the fourth transistor M4 is connected to the first pull-up node Q1; and one terminal of the first capacitor C1 is connected to the control pole of the fourth transistor M4, and the other terminal of the first capacitor C1 is connected to the second pole of the fourth transistor M4. The second output circuit 12B of the second shift register unit 101B comprises a fifth transistor M5 and a second capacitor C2, wherein a first pole of the fifth transistor M5 is connected to the second clock terminal CLKEB, a second pole of the fifth transistor M5 is connected to the second output terminal OUT2 of the second shift register unit 101B, and a control pole of the fifth transistor M5 is connected to the second pull-up node Q2; and one terminal of the second capacitor C2 is connected to the control pole of the fifth transistor M5, and the other terminal of the second capacitor C2 is connected to the second pole of the fifth transistor M5.

It may be understood that when the first pull-up node Q1 is at a high potential, a gate of the fourth transistor M4 is at a high potential; and if the first clock terminal CLKEA provides a high potential, the first output terminal OUT1 of the first shift register unit 101A outputs a high potential. Similarly, when the second pull-up node Q2 is at a high potential, a gate of the fifth transistor M5 is at a high potential; and if the second clock terminal CLKEB provides a high potential, the second output terminal OUT2 of the second shift register unit 101B outputs a high potential.

According to the embodiment illustrated by FIG. 3, the first control circuit 16A of the first shift register unit 101A comprises a fifteenth transistor M15 and a sixteenth transistor M16. Wherein, a first pole of the fifteenth transistor M15 is connected to a control pole and is also connected to the first power source VDDA, a second pole of the fifteenth transistor M15 is connected to the first pull-up node Q1, a first pole of the sixteenth transistor M16 is connected to the first pull-up node Q1, a second pole of the sixteenth transistor M16 is connected to the third power source VGL1, and a control pole of the sixteenth transistor M16 is connected to the first pull-down node QB1. The second control circuit 16B of the second shift register unit 101B comprises a seventeenth transistor M17 and an eighteenth transistor M18. Wherein, a first pole of the seventeenth transistor M17 is connected to a control pole and is also connected to the second power source VDDB, a second pole of the seventeenth transistor M17 is connected to the second pull-up node Q2, a first pole of the eighteenth transistor M18 is connected to the second pull-up node Q2, a second pole of the eighteenth transistor M18 is connected to the third power source VGL1, and a control pole of the eighteenth transistor M18 is connected to the second pull-down node QB2.

It may be understood that when the second power source VDDB operates, the second power source VDDB provides a high potential, and the first power source VDDA provides a low potential, at this moment, the fifteenth transistor M15 is turned off, and the seventeenth transistor M17 is turned on; in this case, if the second pull-up node Q2 is at a high potential, the eighteenth transistor M18 is turned on, the potential of the second pull-down node QB2 is pulled down to a low potential of the third power source VGL1; if the second pull-up node Q2 is at a low potential, the second control circuit 16B stops pulling down the potential of the second pull-down node QB2, that is, the potential of the second pull-down node QB2 is held at a high potential of the second power source VDDB.

Specifically, according to the embodiment illustrated by FIG. 3, the cascade output circuit 18 comprises a sixth transistor M6, wherein a first pole of the sixth transistor M6 is connected to the third clock terminal CLKD, a second pole of the sixth transistor M6 is connected to the cascade output terminal CR, and a control pole of the sixth transistor M6 is connected to the first pull-up node Q1.

It may be understood that when the first pull-up node Q1 is at a high potential, a gate of the sixth transistor M6 is at a high potential, so when the third clock terminal CLKD provides a high potential, the cascade output terminal CR of the first shift register unit 101A outputs a high potential.

Specifically, according to the embodiment illustrated by FIG. 3, the first input circuit 20A of the first shift register unit 101A comprises a twenty-first transistor M21, wherein a first pole of the twenty-first transistor M21 is connected to the fourth power source VDD, a second pole of the twenty-first transistor M21 is connected to the first pull-up node Q1, and a control pole of the twenty-first transistor M21 is connected to the first control terminal STU. The first reset circuit 21A of the first shift register unit 101A comprises a nineteenth transistor M19, wherein a first pole of the nineteenth transistor M19 is connected to the first pull-up node Q1, a second pole of the nineteenth transistor M19 is connected to the third power source VGL1, and a control pole of the nineteenth transistor M19 is connected to the second control terminal STD.

The second input circuit 20B of the second shift register unit 101B comprises a twenty-second transistor M22, wherein a first pole of the twenty-second transistor M22 is connected to the fourth power source VDD, a second pole of the twenty-second transistor M22 is connected to the second pull-up node Q2, and a control pole of the twenty-second transistor M22 is connected to the first control terminal STU. The second reset circuit 21B of the second shift register unit 101B comprises a twentieth transistor M20, wherein a first pole of the twentieth transistor M20 is connected to the second pull-up node Q2, a second pole of the twentieth transistor M20 is connected to the third power source VGL1, and a control pole of the twentieth transistor M20 is connected to the second control terminal STD.

It may be understood that when the first control terminal STU is at a high potential, the twenty-first transistor M21 and the twenty-second transistor M22 are turned on, a high potential provided by the fourth power source VDD is written into the first pull-up node Q1, and the high potential provided by the fourth power source VDD is also written into the second pull-up node Q2. In addition, when the second control terminal STD is at a high potential, the nineteenth transistor M19 and the twentieth transistor M20 are turned on, and the potential of the first pull-up node Q1 and the potential of the second pull-up node Q2 are pulled down to a low potential of the third power source VGL1.

It should be noted that based on the level of the first shift register unit, the first control terminal STU may be the cascade output terminal of the shift register unit which is two levels previous to the first shift register unit, that is to say, assume the level of the first shift register unit is the Nth level, the first control terminal STU may be the cascade output terminal of the $(N-2)^{th}$ level of shift register unit. Based on the level of the first shift register unit, the second control terminal STD may be the cascade output terminal of the shift register unit which is four levels next to the first shift register unit, that is to say, assume the level of the first shift register unit is the Nth level, the second control terminal STD may be the cascade output terminal of the $(N+4)^{th}$ level of shift register unit.

In some embodiments, the first shift register unit 101A further comprises a first reset circuit 23A, and the second shift register unit 101B further comprises a second reset circuit 23B. For example, as shown in FIG. 3, the first reset circuit 23A comprises a thirteenth transistor M13, and the second reset circuit 23B comprises a fourteenths transistor M14. The first reset circuit 23A is connected to the first pull-up node Q1, the third power source VGL1 and a fourth control terminal TRST and is used to reset the first pull-up node Q1 by means of the third power source VGL1 under the control of the fourth control terminal TRST. The second reset circuit 23B is connected to the second pull-up node Q2, the third power source VGL1 and the fourth control terminal TRST and is used to reset the second pull-up node Q2 by means of the third power source VGL1 under the control of the fourth control terminal TRST.

It may be understood that when the fourth control terminal TRST is at a high potential, the first reset circuit 23A of the first shift register unit 101A is turned on to reset the first pull-up node Q1 by means of the third power source VGL1, that is, the potential of the first pull-up node Q1 is pulled down to the potential of the third power source (a low potential); and the second reset circuit 23B of the second shift register unit 101B is turned on to reset the second pull-up node Q2 by means of the third power source VGL1, that is, the potential of the second pull-up node Q2 is pulled down to the potential of the third power source VGL1 (a low potential).

According to the embodiment illustrated by FIG. 3, the first reset circuit 23A of the first shift register unit 101A comprises a thirteenth transistor M13, wherein a first pole of the thirteenth transistor M13 is connected to the first pull-up node Q1, and a second pole of the thirteenth transistor M13 is connected to the third power source VGL1, and a control pole of the thirteenth transistor M13 is connected to the fourth control terminal TRST. The second reset circuit 23B of the second shift register unit 101B comprises a fourteenth transistor M14, wherein a first pole of the fourteenth transistor M14 is connected to the second pull-up node Q2, a second pole of the fourteenth transistor M14 is connected the third power source VGL1, and a control pole of the fourteenth transistor M14 is connected to the fourth control terminal TRST.

It may be understood that when the fourth control terminal TRST is at a high potential, the thirteenth transistor M13 and the fourteenth transistor M14 are turned on, the first pull-up node Q1 and the second pull-up node Q2 are reset by means of the third power source VGL1, that is, the potential of the first pull-up node Q1 and the potential of the second pull-up node Q2 are pulled down to the low potential of the third power source VGL1.

On the basis of the shift register in the above embodiment, the disclosure further provides a gate drive circuit.

Figure 4:
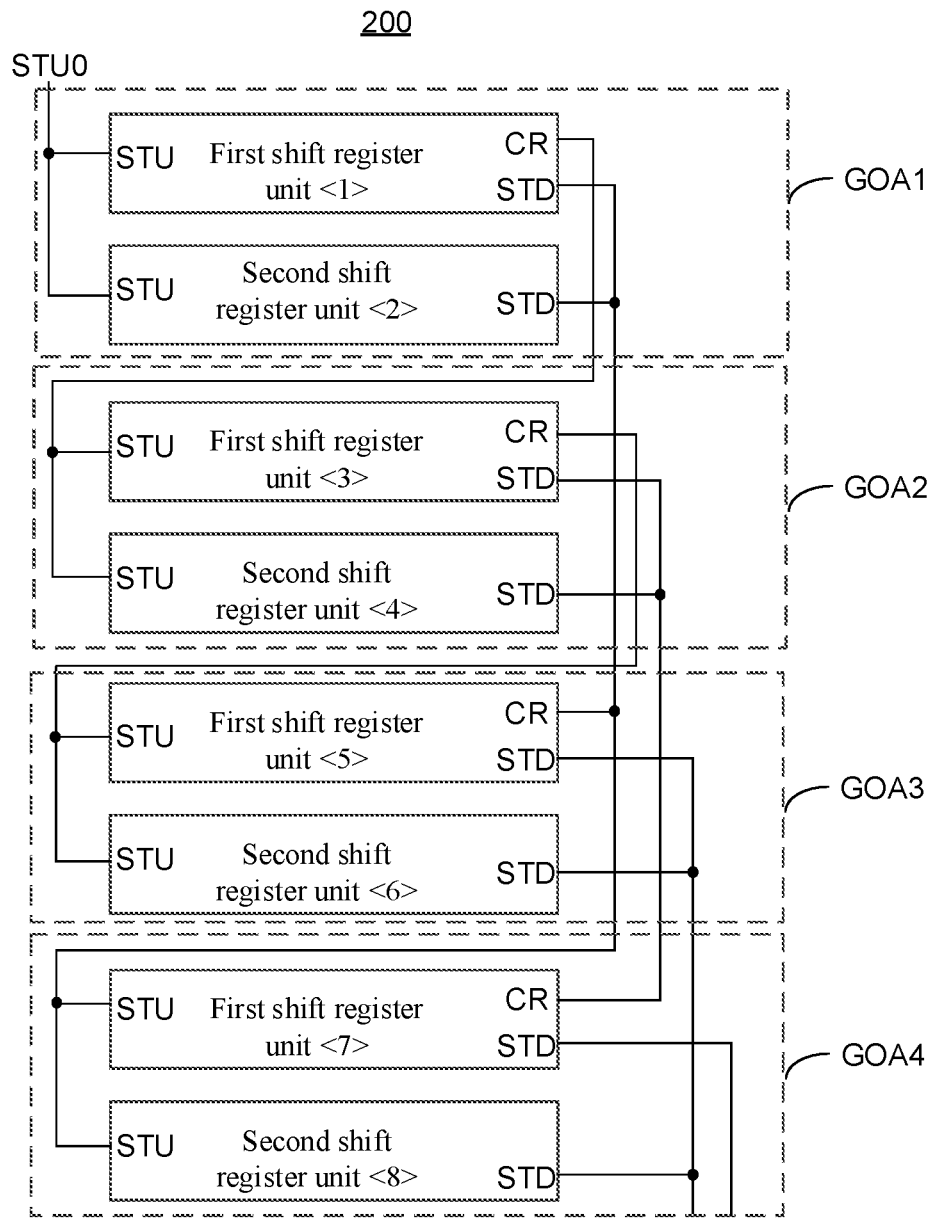
FIG. 4 is a block diagram of a gate drive circuit according to the embodiments of the disclosure.

FIG. 4 is a block diagram of a gate drive circuit according to the embodiments of the disclosure. As shown in FIG. 4, the gate drive circuit 200 comprises multiple shift registers GOA1, GOA2, GOA3 . . . . Each shift register may be implemented by the shift register 100 in the above embodiment. The multiple shift registers GOA1, GOA2, GOA3 . . . are cascaded to N/2 levels. Because each shift register comprises two shift register units (the first shift register unit and the second shift register unit), N levels of cascaded shift register units may be formed. For example, if the first shift register unit of each shift register is at an odd level of the N levels, each second shift register unit is at an even level of the N levels. The first input terminal and the second input terminal STU of the first level of shift register GOA1 may be connected to receive a start signal STU0. The first input terminal and the second input terminal STU of the $n^{th}$ level of shift register GOAn are connected to the cascade output terminal CR of the $(n-1)^{th}$ level of shift register GOA (n−1), and the first reset terminal and the second reset terminal STD of the nth level of shift register GOAn are connected to the cascade output terminal CR of the $(n+2)^{th}$ level of shift register GOA (n+2), wherein N is an integer greater than or equal to 8, and $1<n<(N-2)/2$.

The gate drive circuit provided by the embodiments of the disclosure simplifies the circuit structure, occupies less space, and meets the requirements for high resolution and narrow frame.

Based on the gate drive circuit in the above embodiment, the disclosure further provides a display panel.

Figure 5:
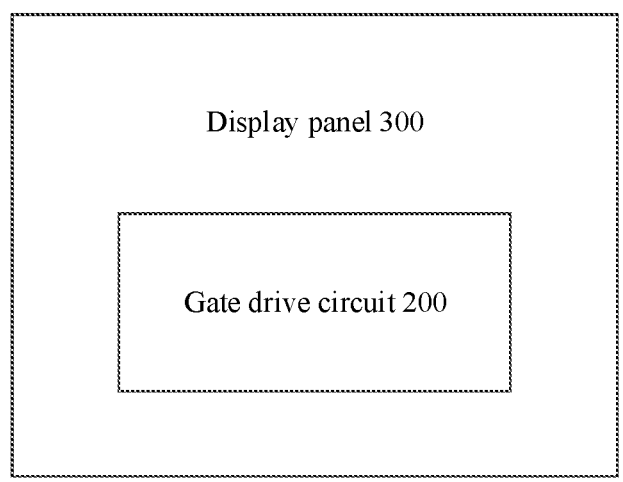
FIG. 5 is a block diagram of a display panel according to the embodiments of the disclosure.

FIG. 5 is a block diagram of a display panel according to the embodiments of the disclosure. As shown in FIG. 5, the display panel 300 provided by the embodiments of the disclosure comprises the gate drive circuit 200 in the above embodiment.

The display panel provided the embodiments of the disclosure simplifies the circuit structure, occupies less space, and meets the requirements for high resolution and narrow frame.

Figure 6:
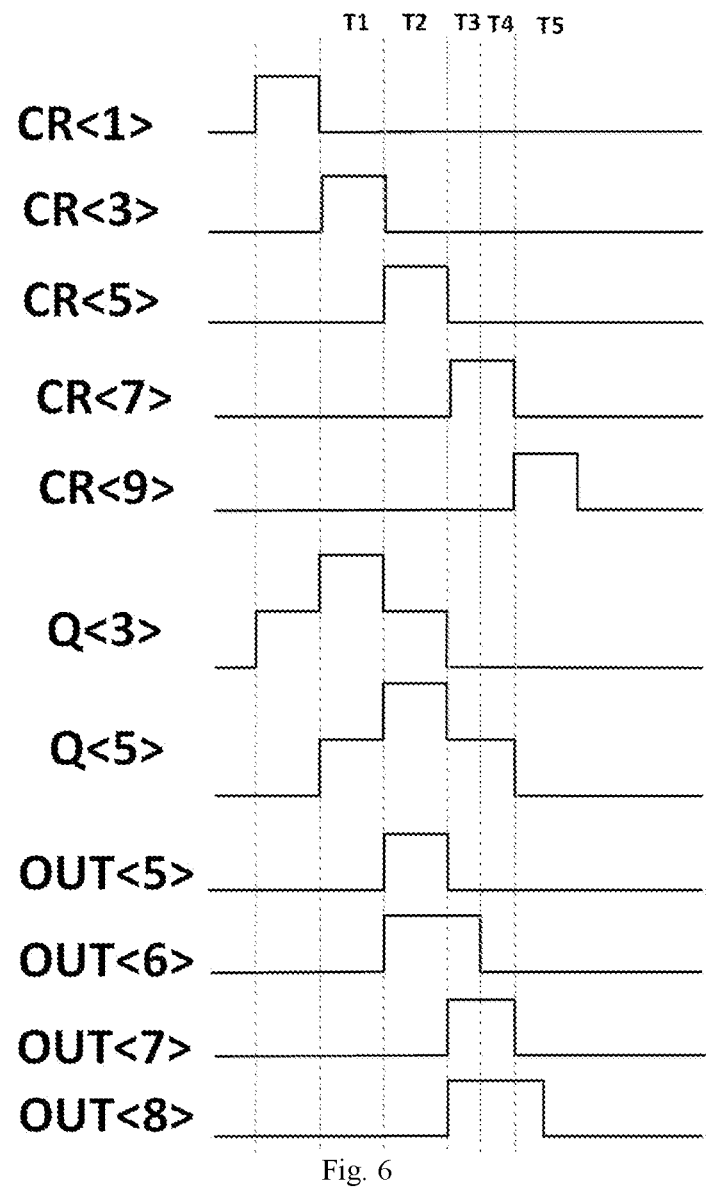
FIG. 6 is a signal sequence diagram of the shift register according to the embodiments of the disclosure.

FIG. 6 is a signal sequence diagram of the shift register according to the embodiments of the disclosure. Next, the operating process of the shift register provided by the embodiments of the disclosure will be described in conjunction with FIG. 3 and FIG. 6.

It should be noted that the third clock signal of the third clock terminal CLKD, the first clock signal of the first clock terminal CLKEA, the second clock signal of the second clock terminal CLKEB, and the fourth control signal of the fourth control terminal TRST are all clock signals generated by an external control circuit. VDDA and VDDB are lowfrequency clock signals (or, DC signals). Wherein, the pulse width relation between these clock signals is adjustable.

First, the first pull-up nodes Q1 and the second pull-up nodes Q2 of all the shift registers in the whole gate drive circuit are reset. Specifically, the fourth control terminal TRST is at a high potential, the twenty-first transistor M21 and the twenty-second transistor M22 are turned on, and the potential of the first pull-up node Q1 and the potential of the second pull-up node Q2 are pulled by means of the third power source VGL1 down to a low potential provided by the third power source VGL1.

The specific operating process of the fifth level of shift register unit and the sixth level of shift register unit (namely, the third level of shift register GOA3) is as follows:

In the initial state, VDDA and VDDB are held at a high potential and a low potential respectively, for example, VDDB is held at a high potential, and VDDA is held at a low potential; at this moment, the seventeenth transistor M17 and the tenth transistor M10 are turned on to enable the second pull-down node QB2 to be at a high potential and enable the first pull-up node Q1 and the second pull-up node Q2 to be at a low potential.

T1: the cascade output terminal CR <N−2> of the shift register unit which is two levels previous to the first shift register unit, namely CR<3> in FIG. 4, is at a high potential, the first control terminal STU is at a high potential, the cascade output terminal CR<N+4> of the shift register unit which is four levels next to the first register unit, namely CR<9> in FIG. 4, is at a low potential, the second control terminal STD is at a low potential, the fourth control terminal TRST, the third clock terminal CLKD, the first clock terminal CLKEA and the second clock terminal CLKEB are all at a low potential, and VDDA and VDDB are held at a high potential and a low potential respectively.

CR<3> is at a high potential (that is, the first control terminal STU is at a high potential), so that the twenty-first transistor M21 and the twenty-second transistor M22 are turned on, and the first pull-up node Q1 (namely Q<5>) and the second pull-up node Q2 (namely Q<6>) allow a high voltage to be written therein to be held at a high potential, so the gate of the fourth transistor M4, the gate of the fifth transistor M5 and the gate of the sixth transistor M8 are held at a high potential. The first pull-up node Q1 and the second pull-up node Q2 are at a high potential, so that the sixteenth transistor M16 and the eighteenth transistor M18 are turned on to pull the first pull-down node QB1 and the second pull-down node QB2 down to a low potential. The third clock terminal CLKD, the first clock terminal CLKEA and the second clock terminal CLKEB are at a low potential, so that the cascade output terminal CR (namely CR <5>), the first output terminal OUT1 (namely OUT <5>) and the second output terminal (namely OUT <6>) are all at a low potential.

T2: the third clock terminal CLKD and the first clock terminal CLKEA are both at a high potential, and the cascade output terminal CR<N−2> of the register unit which is two levels previous to the first shift register unit, namely CR<3> in FIG. 4, is at a low potential, so the first control terminal STU is at a low potential; the cascade output terminal CR<N+4> of the shift register unit which is four levels next to the first shift register unit, namely CR<9> in FIG. 4, is at a low potential, so the second control terminal STD is at a low potential, the fourth control terminal TRST is at a low potential, and VDDA and VDDB are held at a high potential and a low potential respectively.

The first pull-up node Q1 is held at a high potential by the first capacitor C1, the fourth transistor M4 and the sixth transistor M6 are turned on, and the fifth clock terminal CLKD and the first clock terminal CLKEA are at a high potential, so that the second pull-up node Q2 is self-boosted to further increase the potential, and the cascade output terminal CR<5> and the first output terminal OUT<5> output a high potential. At this moment, the third transistor M3 is turned on to turn the second output terminal OUT<6> to a high potential.

Next, the second clock terminal CLKEB, namely CLKE 2, turns to a high level to pull the second output terminal OUT<6> to a high potential.

T3: on the basis of T2, the third clock terminal CLKD and the first clock terminal CLKEA turn to a low potential, and the second clock terminal CLKEB is held at a high potential.

The second pull-up node Q2 is held at a high potential by the second capacitor C2, the fifth transistor M5 is turned on, and the second clock terminal CLKEB is at a high potential, so that the second output terminal OUT<6> is pulled by the high potential of the second clock terminal CLKEB and is held at a high potential.

At this moment, the first pull-up node Q1 is still held at a high potential by the first capacitor C1, and the third clock terminal CLKD and the first clock terminal CLKEA are at a low potential, so that the cascade output terminal CR<5> and the first output terminal OUT1<5> outputs a low potential.

T4: on the basis of T3, the second clock terminal CLKEB turns to a low potential.

At this moment, the second pull-up node Q2 is still held at a high potential by the second capacitor C2, and the second clock terminal CLKEB is at a low potential, so that the second output terminal OUT<6> outputs a low potential.

T5: on the basis of T4, CR<N+4>(CR<9>) is at a high potential, that is, the second control terminal STD is at a high potential.

At this moment, CR<9> is at a high potential, so that the nineteenth transistor M19 and the twentieth transistor M20 are turned on, and the first pull-up node Q1 and the second pull-up node Q2 are pulled down to be reset. In addition, the first pull-up node Q1 and the second pull-up node Q2 are pulled down, so that the sixteenth transistor M16 and the eighteenth transistor M18 are turned off, the second pull-down node QB2 is turned to a high potential, the second transistor M2, the eighth transistor M8, the tenth transistor M10 and the twelfth transistor M12 are turned on, and the first pull-up node Q1, the second pull-up node Q2, the cascade output terminal CR<5>, the first output terminal OUT1<5> and the second output terminal OUT1<5> are pulled by the low potential of the third power source VGL1 and are held at a low potential.

In this way, display of all the rows is completed.

In the embodiment illustrated by FIG. 3, two pull-down transistors of a large size are saved by means of a shared structure, and thus, a large space is saved.

To sum up, according to the shift register provided by the embodiments of the disclosure, the two shift register units share the first pull-down circuit, so that the circuit structure is simplified, less space is occupied, and the requirements for high resolution and narrow frame are met.

Corresponding to the shift register in the above embodiments, the disclosure further provides a drive method of a shift register.

Figure 7:
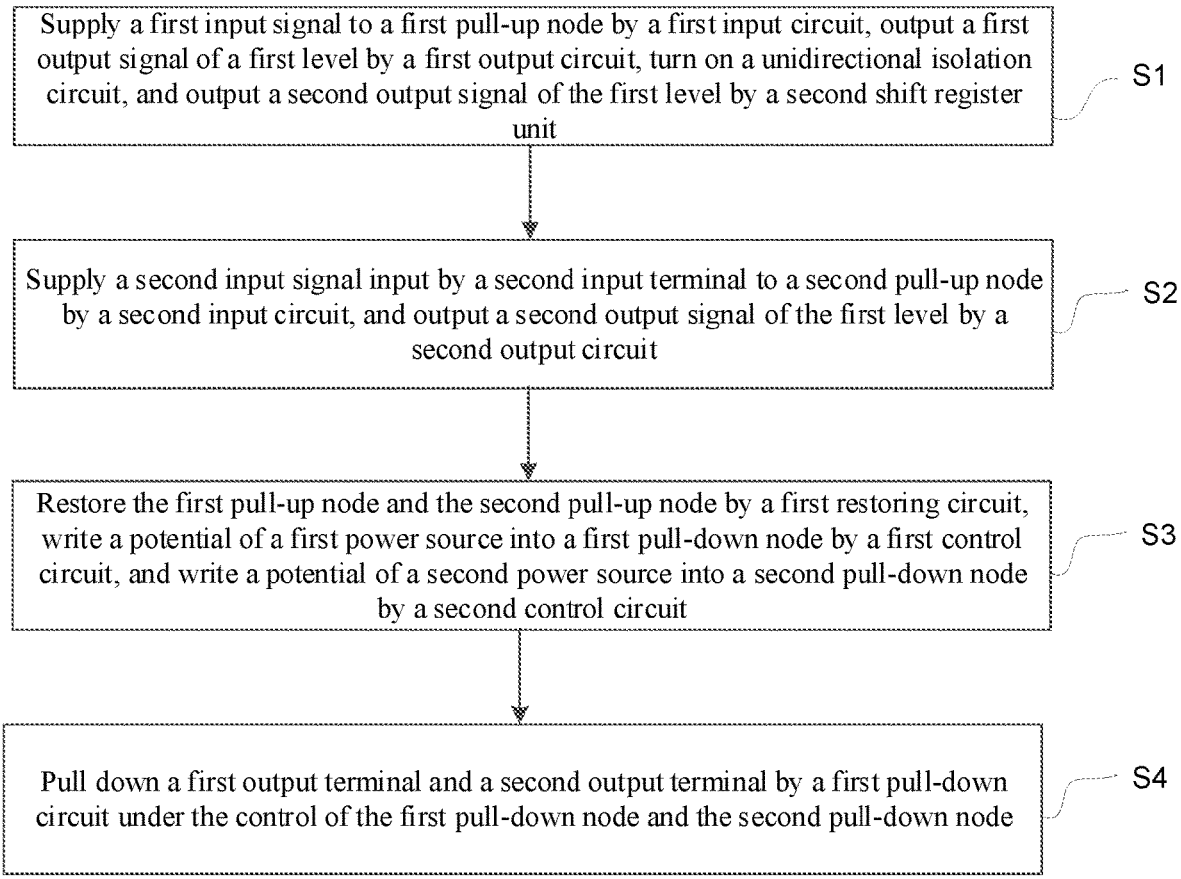
FIG. 7 is a flow diagram of a drive method of a shift register according to the embodiments of the disclosure.

FIG. 7 is a flow diagram of the drive method of the shift register according to the embodiments of the disclosure. The shift register comprises a first shift register unit and a second shift register unit, wherein the first shift register unit and the second shift register unit share a first pull-down circuit. As shown in FIG. 7, the drive method of the shift register comprises the following steps:

S1: a first input circuit supplies a first input signal, input by a first input terminal, to a first pull-up node, a first output circuit controls a first output terminal of the first shift register unit to output a first output signal of a first level according to a potential of the first pull-up node and a first clock signal of a first clock terminal, and potentials of the first output terminal and a second output terminal enable a unidirectional isolation circuit to be turned on to enable the second output terminal of the second shift register unit to output a second output signal of the first level.

S2: a second input circuit supplies a second input signal, input by a second input terminal, to a second pull-up node, and controls the second output terminal to keep outputting the second output signal of the first level according to a potential of a second pull-up node and a second clock signal of a second clock terminal.

S3: a first reset circuit resets the first pull-up node and the second pull-up node under the control of a second control terminal, the potential of the first pull-up node enables a first control circuit to write a potential of a first power source into a first pull-down node, and the potential of the second pull-up node enables a second control circuit to write a potential of a second power source into a second pull-down node.

S4: a first pull-down circuit pulls down the first output terminal and the second output terminal under the control of the first pull-down node and the second pull-down node.

In the above embodiments, the first level may be a high level, and the second level may be a low level. The embodiments of the disclosure are not limited to this. In some embodiments, the first level may be a low level, and the second level may be a high level.

It should be noted that the explanation of the embodiments of the shift register is also applicable to the drive method of the shift register in this embodiment, and will not be detailed here.

According to the drive method of the shift register provided by the embodiments of the disclosure, the two shift register units share the first pull-down circuit, so that the circuit structure is simplified, less space is occupied, and the requirements for high resolution and narrow frame are met.

"One embodiment", "some embodiments", "example", "specific example", or "some examples" in this specification means that specific features, structures, materials, or characteristics described in conjunction with said embodiment or example are included in at least one embodiment or example of the disclosure. The illustrative expression of these terms in this specification does not definitely refer to the same embodiment or example. In addition, the specific features, structures, materials or characteristics may be combined in any one or more embodiments or examples in any appropriate manners. Moreover, those skilled in the art may integrate and combine different embodiments or examples described in the specification and the features of different embodiments or examples without any mutual contradictions.

In addition, the terms "first" and "second" are merely for the purpose of description, and should not be construed as indicating or implying relative importance or implicitly indicating the number of technical features referred to. Thus, a feature defined by "first" or "second" may explicitly or implicitly refer to the inclusion of one or more said feature. Unless otherwise specified, "multiple" in the description of the disclosure refers to at least two, such as two or three.

Any process or method described by the flow diagram or in other manners may be construed as one or more modules, segments or parts including codes of executable instructions for implementing customized logic functions or steps of the process. In addition those skilled in the art would appreciate that the preferred embodiments of the invention may be implemented in other ways, and may be implemented not in the order illustrated or discussed, and the functions involved may be performed basically synchronously or in a reverse order.

The logics and/or steps shown in the flow diagram or described in other ways in the specification may be construed as, for example, a fixed-sequence list of executable instructions for realizing logic functions, and may be specifically implemented in any computer-readable media to be used by an instruction execution system, device or facility (such as computer-based system, a system comprising a processor, or other systems capable of acquiring instructions from the instruction execution system, facility or device to execute the instructions), or be used in conjunction with the instruction execution system, device or facility. In this specification, the "computer-readable media" may be any devices including, storing, communicating, propagating or transmitting programs and used by or in conjunction with the instruction execution system, device or facility. More specifically, examples of the computer-readable media (a non-exhaustive list) include: an electrical connection part (electronic device) provided with one or more wirings, a portable computer cartridge disk (disk device), a random access memory (RAM), a read-only memory (ROM), an electrically programmable read-only memory (EPROM or flash memory), an optical fiber device, and a portable CD read-only memory (CDROM). In addition, the computer-readable media may even be paper printed with the program or other suitable media because the paper or other media can be optically scanned to electrically obtain the program by edition, interpretation, or processing in other appropriate manners when necessary, and then the program is stored in a computer memory.

It should be understood that all parts of the invention may be implemented by hardware, software, firmware, or combinations thereof. In the above embodiments, multiple steps or methods may be stored in a memory and implemented by executing corresponding software or firmware by an appropriate instruction execution system. For example, if implemented by hardware like in other embodiments, the parts may be implemented by any one or the combination of the following techniques commonly known in the art: a discrete logic circuit provided with a logic gate circuit for realizing the logic function of data signals, an application-specific integrated circuit with an appropriate combinational logic gate circuit, a programmable gate array (PGA), a field programmable gate array (FPGA), and the like.

Those ordinarily skilled in the art would appreciate that all or part of the steps of the method in the above embodiments may be implemented by relevant hardware instructed by a program that may be stored in a computer-readable storage medium, and when the program is executed, one or the combination of the steps of the method in the above embodiments will be implemented.

In addition, the functional units in the embodiments of the disclosure may be integrated in one processing unit or be physically independent, or two or more units may be integrated in one unit. The integrated unit may be implemented in the form of hardware or in the form of a software functional module. When implemented in the form of software functional units and sold or used as independent products, the integrated units may be stored in a computer-accessible memory.

The storage medium mentioned above may be a read-only memory, a magnetic disk, a CD, or the like. Although the embodiments of the invention have been illustrated and described above, it should be understood that the above embodiments are merely illustrative ones, and should not be construed as limitations of the invention. Those ordinarily skilled in the art can make variations, amendments, substitutions and transformations to the above embodiments within the scope of the invention.

The invention claimed is:

1. A shift register, wherein the shift register comprises: a first shift register unit, wherein the first shift register unit comprises a first input circuit, a first output circuit, a first pull-down circuit and a unidirectional isolation circuit, the first input circuit is connected to a first input terminal and a first pull-up node and is configured to supply a first input signal, input by the first input terminal, to the first pull-up node, the first output circuit is connected to the first pull-up node, a first output terminal and a first clock terminal and is configured to control the first output terminal to output a first output signal according to a potential of the first pull-up node and a first clock signal of the first clock terminal, and the first output terminal is connected to the first pull-down circuit by means of the unidirectional isolation circuit; and a second shift register unit, wherein the second shift register unit comprises a second input circuit and a second output circuit, the second input circuit is connected to a second input terminal and a second pull-up node and is configured to supply a second input signal, input by the second input terminal, to the second pull-up node, the second output circuit is connected to the second pull-up node, a second output terminal and a second clock terminal and is configured to control the second output terminal to output a second output signal according to a potential of the second pull-up node and a second clock signal of the second clock terminal, the second output terminal is connected to a node between the first pull-down circuit and the unidirectional isolation circuit, and the unidirectional isolation circuit is configured to be turned on or off under the control of potentials of the first output terminal and the second output terminal;

the first shift register unit further comprises a first control circuit, wherein the first control circuit is connected to the first pull-up node, a first pull-down node, a first power signal terminal and a first reference signal terminal, and the first control circuit is configured to control a potential of the first pull-down node based on a potential of the first power signal terminal and a potential of the first reference signal terminal under the control of the first pull-up node;

the second shift register unit further comprises a second control circuit, wherein the second control circuit is connected to the second pull-up node, a second pull-down node, a second power signal terminal and the first reference signal terminal, and the second control circuit is configured to control a potential of the second pull-down node based on a potential of the second power terminal and the potential of the first reference signal terminal under the control of the second pull-up node;

wherein, the first pull-down circuit is connected to the first pull-down node and the second pull-down node and is configured to pull down a potential of the node between the first pull-down circuit and the unidirectional isolation circuit under the control of the first pull-down node and the second pull-down node.

2. The shift register according to claim 1, wherein the first shift register unit further comprises a second pull-down circuit, and the second pull-down circuit is connected to the first pull-up node, the first pull-down node and the second pull-down node, and the second pull-down circuit is configured to pull down the potential of the first pull-up node under the control of the first pull-down node or the second pull-down node.

3. The shift register according to claim 1, wherein the second shift register unit further comprises a third pull-down circuit, and the third pull-down circuit is connected to the second pull-up node, the first pull-down node and the second pull-down node, and the third pull-down circuit is configured to pull down the potential of the second pull-up node under the control of the first pull-down node and the second pull-down node.

4. The shift register according to claim 1, wherein the potential of the first power signal terminal and the potential of the second power signal terminal are opposite in phase.

5. The shift register according to claim 1, wherein the first shift register unit further comprises a cascade output circuit and a fourth pull-down circuit, the cascade output circuit is connected to a third clock terminal, the first pull-up node and a cascade output terminal, and the cascade output circuit is configured to control the cascade output terminal to output a cascade output signal according to the potential of the first pull-up node and a third clock signal of the third clock terminal, and the fourth pull-down circuit is connected to the cascade output terminal, the first pull-down node and the second pull-down node, and the fourth pull-down circuit is configured to pull down a potential of the cascade output terminal under the control of the first pull-down node and the second pull-down node.

6. The shift register according to claim 1, wherein,
the first shift register unit further comprises a first reset circuit, and the first reset circuit is connected to the first pull-up node, the first reference signal terminal and a first reset terminal, and the first reset circuit is configured to reset the first pull-up node to the potential of the first reference signal terminal under the control of the first reset terminal; and
the second shift register unit further comprises a second reset circuit, and the second reset circuit is connected to the second pull-up node, the first reference signal terminal and a second reset terminal, and the second reset circuit is configured to reset the second pull-up node to the potential of the first reference signal under the control of the second reset terminal.

7. The shift register according to claim 1, wherein the first pull-down circuit comprises a first transistor and a second transistor, a first pole of the first transistor and a first pole of the second transistor are connected to the unidirectional isolation circuit and the second output terminal, a second pole of the first transistor and a second pole of the second transistor are connected to the first reference signal terminal, a control pole of the first transistor is connected to the first pull-down node, and a control pole of the second transistor is connected to the second pull-down node.

8. The shift register according to claim 1, wherein,
the unidirectional isolation circuit comprises a third transistor, a first pole and a control pole of the third transistor are connected to the first output terminal of the first shift register unit, and a second pole of the third transistor is connected to the first pull-down circuit and the second output terminal.

9. The shift register according to claim 2, wherein,
the second pull-down circuit comprises a seventh transistor and an eighth transistor, a first pole of the seventh transistor and a first pole of the eighth transistor are connected to the first pull-up node, a second pole of the seventh transistor and a second pole of the eighth transistor are connected to the first reference signal terminal, a control pole of the seventh transistor is connected to the first pull-down node, and a control pole of the eighth transistor is connected to the second pull-down node.

10. The shift register according to claim 3, wherein the third pull-down circuit comprises a ninth transistor and a tenth transistor, a first pole of the ninth transistor and a first pole of the tenth transistor are connected to the second pull-up node, a second pole of the ninth transistor and a second pole of the tenth transistor are connected to the first reference signal terminal, a control pole of the ninth transistor is connected to the first pull-down node, and a control pole of the tenth transistor is connected to the second pull-down node.

11. The shift register according to claim 5, wherein the fourth pull-down circuit comprises an eleventh transistor and a twelfth transistor, a first pole of the eleventh transistor and a first pole of the twelfth transistor are connected to the cascade output terminal, a second pole of the eleventh transistor and a second pole of the twelfth transistor are connected to the first reference signal terminal, a control pole of the eleventh transistor is connected to the first pull-down node, and a control pole of the twelfth transistor is connected to the second pull-down node.

12. A gate drive circuit, wherein the gate drive circuit comprises multiple shift registers according to claim 1.

13. A display panel, wherein the display panel comprises the gate drive circuit according to claim 12.

14. A drive method for the shift register according to claim 1, wherein the method comprises:
supplying, by the first input circuit, a first input signal input by the first input terminal to the first pull-up node, controlling, by the first output circuit, the first output terminal of the first shift register unit to output a first output signal of a first level according to the potential of the first pull-up node and the first clock signal of the first clock terminal, enabling, by the potential of the first output terminal and the potential of the second output terminal, the unidirectional isolation circuit to be turned on to control the second output terminal of the second shift register unit to output a second output signal of the first level; and
supplying, by the second input circuit, a second input signal input by the second input terminal to the second pull-up node, and controlling, by the second output circuit, the second output terminal to keep outputting the second output signal of the first level according to the potential of the second pull-up node and the second clock signal of the second clock terminal.

15. The method according to claim 14, wherein the first shift register unit further comprises the first control circuit and the first reset circuit, and the second shift register unit further comprises the second control circuit and the second reset circuit, and the method further comprises:

reset, by the first reset circuit, the first pull-up node under the control of the first reset terminal, and reset, by the second reset circuit, the second pull-up node under the control of the second reset terminal;
enabling, by the potential of the first pull-up node, the first control circuit to write the potential of the first power signal terminal into the first pull-down node, and enabling, by the potential of the second pull-up node, the second control circuit to write the potential of the second power signal terminal into the second pull-down node; and
pulling down the first output terminal and the second output terminal by the first pull-down circuit under the control of the first pull-down node and the second pull-down node.

16. The shift register according to claim 2, wherein the shift register further comprises:
the potential of the first power signal terminal and the potential of the second power signal terminal are opposite in phase.

17. The gate drive circuit according to claim 12, wherein the first shift register unit further comprises a first control circuit, wherein the first control circuit is connected to the first pull-up node, a first pull-down node, a first power signal terminal and a first reference signal terminal, and the first control circuit is configured to control a potential of the first pull-down node based on a potential of the first power signal terminal and a potential of the first reference signal terminal under the control of the first pull-up node; the second shift register unit further comprises a second control circuit, wherein the second control circuit is connected to the second pull-up node, a second pull down node, a second power signal terminal and the first reference signal terminal, and the second control circuit is configured to control a potential of the second pull-down node based on a potential of the second power terminal and the potential of the first reference signal terminal under the control of the second pull up node; wherein, the first pull-down circuit is connected to the first pull-down node and the second pull-down node and is configured to pull down a potential of the node between the first pull-down circuit and the unidirectional isolation circuit under the control of the first pull-down node and the second pull-down node.

18. The gate drive circuit according to claim 17, wherein the first shift register unit further comprises a second pull-down circuit, and the second pull-down circuit is connected to the first pull-up node, the first pull-down node and the second pull-down node, and the second pull-down circuit is configured to pull down the potential of the first pull-up node under the control of the first pull-down node or the second pull-down node.

19. The gate drive circuit according to claim 17, wherein the second shift register unit further comprises a third pull-down circuit, and the third pull-down circuit is connected to the second pull-up node, the first pull-down node and the second pull-down node, and the third pull-down circuit is configured to pull down the potential of the second pull-up node under the control of the first pull-down node and the second pull-down node.

* * * * *